(12) United States Patent
Gomm

(10) Patent No.: US 8,605,538 B2
(45) Date of Patent: *Dec. 10, 2013

(54) MULTIPLE DEVICE APPARATUS, SYSTEMS, AND METHODS

(71) Applicant: Micron Technology, Inc., Boise, ID (US)

(72) Inventor: Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/652,108

(22) Filed: Oct. 15, 2012

(65) Prior Publication Data

US 2013/0039144 A1 Feb. 14, 2013

Related U.S. Application Data

(63) Continuation of application No. 12/163,856, filed on Jun. 27, 2008, now Pat. No. 8,289,806.

(51) Int. Cl.
*G11C 8/18* (2006.01)

(52) U.S. Cl.
USPC .................................................. 365/233.11

(58) Field of Classification Search
None
See application file for complete search history.

(56) References Cited

U.S. PATENT DOCUMENTS

| 6,977,655 | B2 | 12/2005 | Ryan |
| 8,289,806 | B2 * | 10/2012 | Gomm ............ 365/233.1 |
| 2006/0233012 | A1 | 10/2006 | Sekiguchi et al. |
| 2008/0204091 | A1 | 8/2008 | Choo et al. |
| 2009/0323456 | A1 | 12/2009 | Gomm |

* cited by examiner

*Primary Examiner* — Hoai V Ho
*Assistant Examiner* — James G Norman
(74) *Attorney, Agent, or Firm* — Schwegman Lundberg & Woessner, P.A.

(57) ABSTRACT

Apparatus, systems, and methods are disclosed that operate to generate a clock signal in a die in a stack and to receive the clock signal in another die in the stack. Additional apparatus, systems, and methods are disclosed.

28 Claims, 5 Drawing Sheets

MULTIPLE DEVICE APPARATUS, SYSTEMS, AND METHODS

PRIORITY APPLICATION

This application is a continuation of U.S. application Ser. No. 12/163,856, filed Jun. 27, 2008, which is incorporated herein by reference in its entirety.

BACKGROUND

Integrated circuit devices, including memory devices, often are used in computers and other electronic products, e.g., digital televisions, digital cameras, and cellular phones, to store data and other information. Multiple integrated circuit devices are often used together in a system.

DETAILED DESCRIPTION

Systems including multiple devices typically generate a clock signal in each device, and each device generating a clock signal consumes a substantial amount of power to do so. The inventors have discovered that the challenges noted above, as well as others, can be addressed by distributing a clock signal from a delay-locked loop (DLL) or a phase-locked loop (PLL) or multiple DLLs or PLLs in one or more integrated circuit dies to a collection of integrated circuit dies. Other DLLs or PLLs in the collection can be shut off to reduce power consumption.

Figure 1:
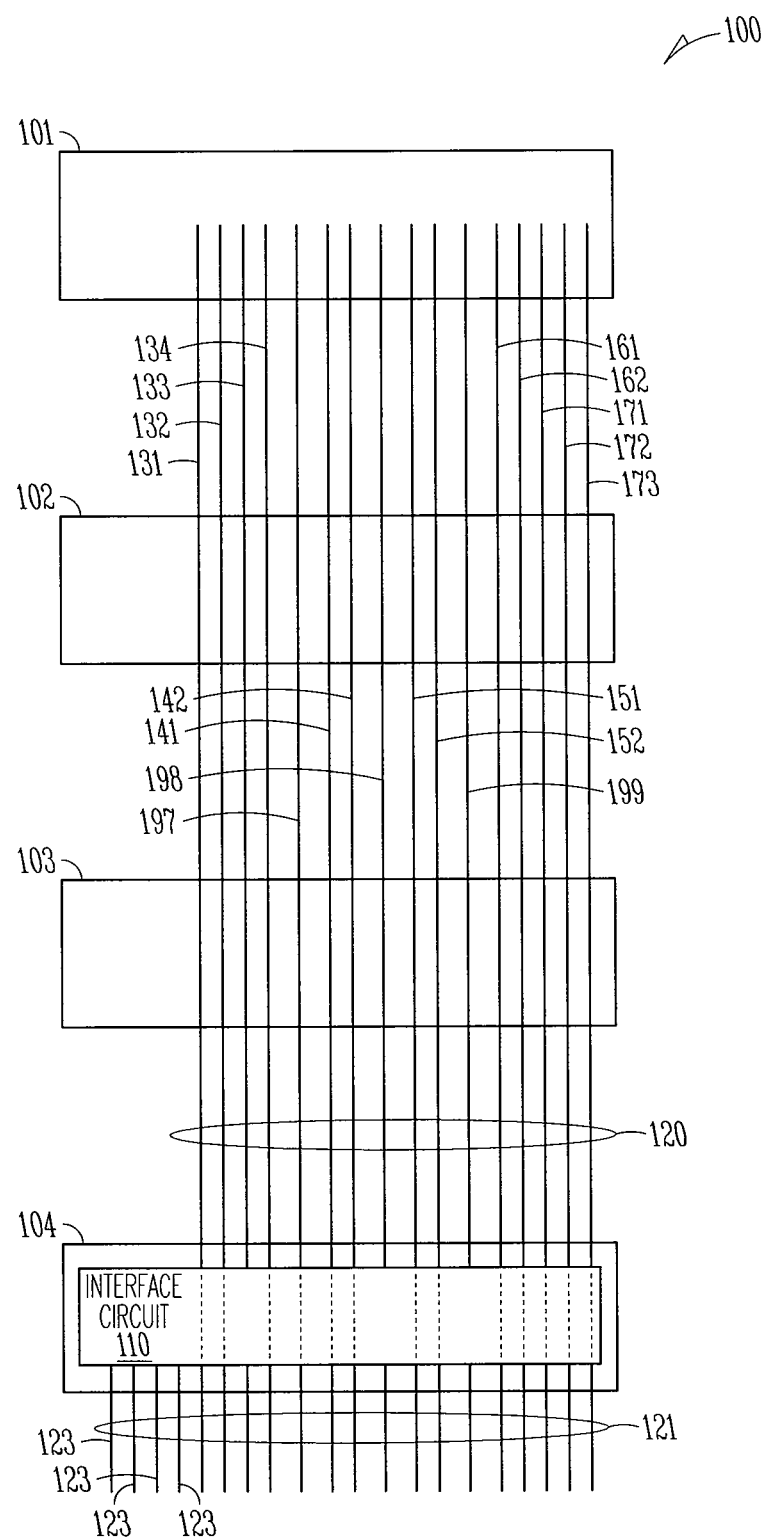
FIG. 1 is a block diagram of a stack including integrated circuit dies and channels according to various embodiments of the invention.

FIG. 1 is a block diagram of a stack 100 including integrated circuit dies (dies) and channels according to various embodiments of the invention. A stack of dies includes a collection or plurality of dies coupled together to exchange data, address, and control signals. The stack 100 includes several separate dies 101, 102, 103, and 104 and groups 120 and 121 of channels to transfer information. Each of the dies 101, 102, 103, and 104 is formed of semiconductor material and includes electronic circuitry. The dies 101, 102, 103, and 104 may communicate with each other through the channels in the group 120 and with other external devices such as a processor, a memory controller, or another device through an interface circuit 110 in the die 104. The interface circuit 110 may be a logic circuit. The channels in the groups 120 and 121 extend through or into the dies 101, 102, 103, and 104 in the stack 100. The dies 101, 102, 103, and 104 may have a different order, arrangement, or orientation with respect to each other in the stack 100 according to various embodiments of the invention. The stack 100 may include more or fewer dies according to various embodiments of the invention.

Information such as one or more of data, address, and control information or other information may be transferred through the channels in the groups 120 and 121. The group 120 includes multiple channels 131, 132, 133, 134, 141, 142, 151, 152, 161, 162, 171, 172, 173, 197, 198, and 199, and may include more channels. The channels in the group 121 include the channels 131-199 in the group 120 and additional channels 123. Information is transferred among the dies 101, 102, 103, and 104 through the channels 131-199 in the group 120, and information such as data and control information may also be transferred through the additional channels 123 between the interface circuit 110 and an external device such as a processor, a memory controller, or another device. Each of the channels 123-199 may be an electrically conductive path.

The channels 131-199 in the group 120 may be arranged into different buses to transfer different types of information. For example, the channels 131, 132, 133, and 134 may form a data bus to transfer information representing data to be stored in or read from the dies 101, 102, 103, and 104. The channels 141 and 142 may form an address bus to transfer information representing an address of a location in the dies 101, 102, 103, and 104 where data may be stored. The channels 151 and 152 may form a control bus to transfer control information to control operations of the stack 100. The channels 161 and 162 may form a power bus to provide power to the dies 101, 102, 103, and 104. For example, the channels 161 and 162 may carry voltages Vcc and Vss, where Vss can be a ground voltage reference. The channels 171, 172, 173, 197, 198, and 199 may be added to the above-described buses or be used for other purposes.

In various embodiments, a single DLL or PLL in one of the dies 101-104 in the stack 100 is operated to generate a clock signal that is distributed to others of the dies 101-104 in the stack 100 through one or more of the channels 131-199 in the group 120. Other DLLs or PLLs in the dies 101-104 are capable of being shut off to reduce power consumption in the stack 100. In various embodiments, two or more DLLs or PLLs in the stack 100 are operated to generate clock signals that are distributed to the dies 101-104 through two or more of the channels 131-199 in the group 120. Other DLLs or PLLs in the dies 101-104 can be shut off to reduce power consumption in the stack 100. In various embodiments, one or more of the dies 101-104 in the stack 100, such as the die 104, may operate a DLL or PLL to generate its own clock signal that is not distributed to others of the dies 101-104 in the stack 100.

The groups 120 and 121 shown in FIG. 1 include a specific number of channels as an example. The number of channels in the groups 120 and 121 may vary. For example, the group 120 may include tens, hundreds, or thousands of channels extending through or into the dies 101, 102, 103, and 104 in the stack 100.

The stack 100 shown in FIG. 1 may include only a single memory device or processor such that parts of the single memory device or processor may be distributed among the dies 101, 102, 103, and 104. The stack 100 may also include multiple memory devices or processors where each of the dies 101, 102, 103, and 104, by itself, includes a separate memory device or processor. The dies 101-104 may have a different order, arrangement, or orientation with respect to each other in the stack 100 according to various embodiments of the invention. The dies 101-104 may include processors and/or memory devices such as Flash memory devices, DRAMs, or SDRAMs. The dies 101-104 may be of the same design or may be of different designs.

Figure 2:
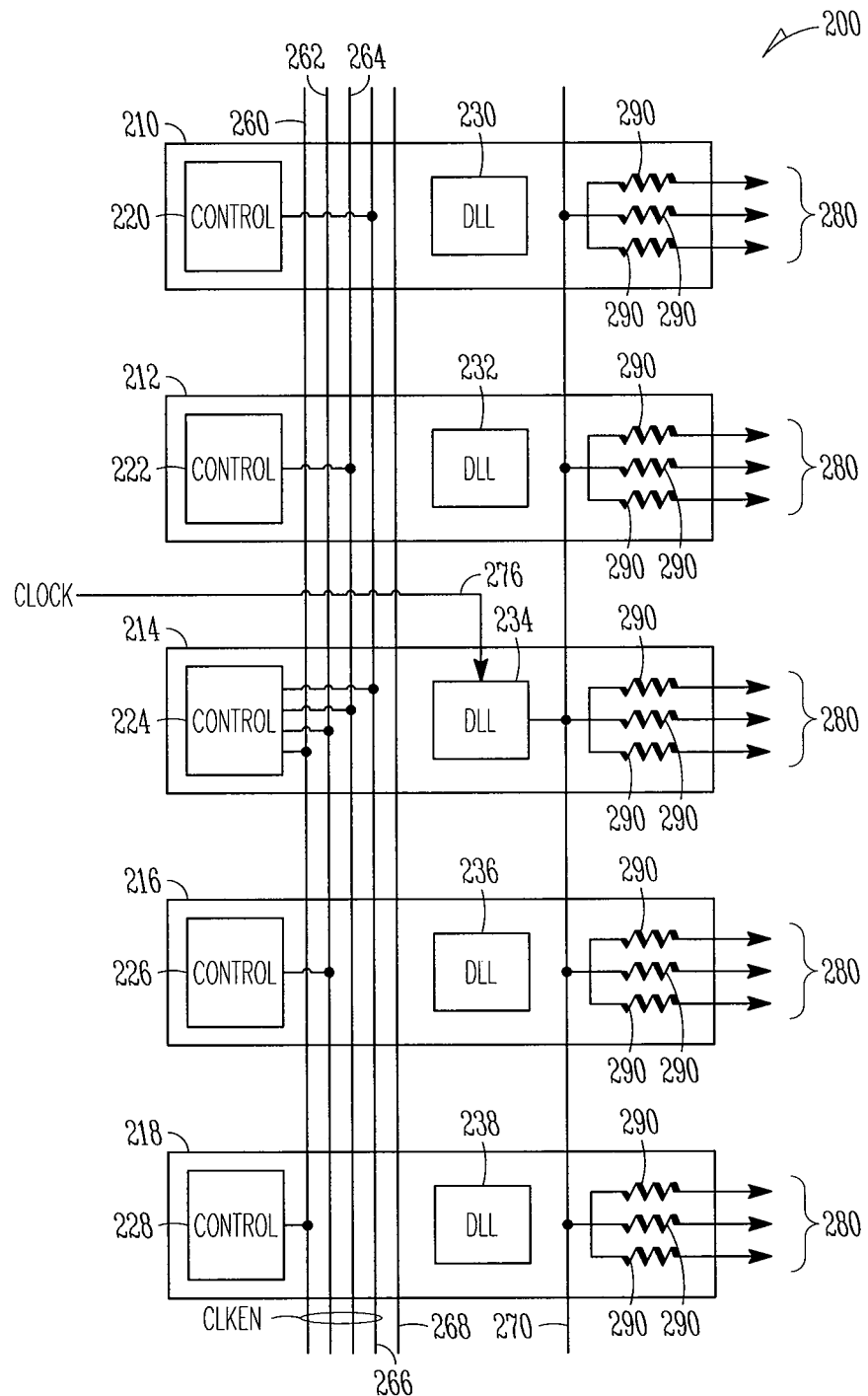
FIG. 2 is a block diagram of a stack including integrated circuit dies and channels according to various embodiments of the invention.

FIG. 2 is a block diagram of a stack 200 including integrated circuit dies and channels according to various embodiments of the invention. The stack 200 includes five separate integrated circuit dies 210, 212, 214, 216, and 218. Each of the integrated circuit dies 210, 212, 214, 216, and 218 is formed from a semiconductor material and includes electronic circuitry. Each of the dies 210, 212, 214, 216, and 218 includes a respective control circuit 220, 222, 224, 226, and 228 and a respective DLL 230, 232, 234, 236, and 238. The dies 210, 212, 214, 216, and 218 may include processors and/or memory devices such as Flash memory devices, DRAMs, or SDRAMs. The dies 210, 212, 214, 216, and 218 may be of the same design or may be of different designs.

The stack 200 includes several channels 260, 262, 264, 266, 268, and 270 to transfer information between the dies 210-218. The channels 260-270 may be electrically conductive paths. The channels 260-270 extend through or into the dies 210-218. The stack 200 may include more channels that are not shown.

DLLs such as the DLLs 230, 232, 234, 236, and 238 are used to generate an internal periodic signal such as an internal clock signal based on a periodic reference signal such as, for example, an external clock signal. Each DLL adjusts a phase of the internal periodic signal to maintain a specific phase relationship with the periodic reference signal. DLLs are used, for example, in high-speed clocked memories such as synchronous dynamic random access memory (SDRAM) devices. Each DLL consumes a substantial amount of power when operating to generate an internal periodic signal such as an internal clock signal.

In various embodiments, an internal clock signal generated by one of the DLLs 230, 232, 234, 236, and 238 is received by all of the dies 210-218 in the stack 200. In various embodiments, some, but not all, of the of the dies 210-218 in the stack 200 receive the internal clock signal. The internal clock signal may also be called a clock synchronization signal. The DLLs 230-238 not generating the internal clock signal are capable of being shut off to reduce power consumption. According to various embodiments of the invention shown in FIG. 2, the DLL 234 in the die 214 is coupled to receive an external clock signal on a line 276 and is operated to generate an internal clock signal by adjusting a phase of the internal clock signal to maintain a specific phase relationship with the external clock signal on the line 276. The die 214 may be called a generator die or a source die. The internal clock signal is available within the die 214 and is coupled from the DLL 234 to the channel 270 and thereafter distributed to one or more of the other dies 210, 212, 216, and 218 in the stack 200 through the channel 270. The dies 210, 212, 216, and 218 in the stack 200 receiving the internal clock signal may be called receiver dies.

The DLLs 230-238 not generating the internal clock signal may be shut off by gating the external clock signal off with, for example, a NAND gate. An enable/disable control line for each of the DLLs 230-238 may be set using a fuse or an antifuse.

Each of the dies 210, 212, 214, 216, and 218 includes a respective plurality of clock distribution terminals 280 in a clock distribution tree to distribute a clock signal generated by a DLL. Three clock distribution terminals 280 are shown extending from each of the dies 210, 212, 214, 216, and 218 from conductive lines that have a parasitic resistance 290 and a parasitic capacitance (not shown). Each clock distribution terminal 280 may be coupled to a data output terminal (not shown) such as, for example, a D-type flip-flop. More specifically, each clock distribution terminal 280 may be coupled to a clock input of a D-type flip-flop to clock data received at a D input through the D-type flip flop. The clock signal generated by a DLL may be distributed by straight line conductors or a T-shaped clock distribution structure according to various embodiments.

The dies 210-218 in the stack 200 may communicate a request for a clock signal with a clock enable (CLKEN) signal coupled to one or more of the channels 260-270. With respect to the various embodiments shown in FIG. 2, each die 210, 212, 216, and 218 may generate its own CLKEN signal to indicate to the die 214 that it is requesting the internal clock signal for a purpose such as, for example, data transmission. The control circuit 224 may generate a CLKEN signal internally for the die 214 to indicate whether the die 214 itself will use the internal clock signal to be generated. The control circuit 220 in the die 210 may generate a CLKEN signal coupled to the channel 266. The control circuit 222 in the die 212 may generate a CLKEN signal coupled to the channel 264. The control circuit 226 in the die 216 may generate a CLKEN signal coupled to the channel 262. The control circuit 228 in the die 218 may generate a CLKEN signal coupled to the channel 260. The channel 268 may be used for a purpose unrelated to the internal clock signal.

The die 214 is coupled to the channels 260-266 to receive the CLKEN signals from the dies 210, 212, 216, and 218. One or more of the dies 210-218 may be in an idle state in which it is not performing tasks that use the internal clock signal. The control circuit 224 in the die 214 receives the CLKEN signals on the channels 260-266 from the dies 210, 212, 216, and 218 and instructs the DLL 234 to generate the internal clock signal when at least one of the dies 210, 212, 214, 216, and 218 requests it. The DLL 234 can be shut off when none of the dies 210-218 requests the internal clock signal to perform an operation. The channels 260-270 between the dies 210, 212, 214, 216, and 218 are short enough such that clock skew and clock jitter resulting from the distribution of the clock signal across the dies 210-218 do not substantially impact performance.

In various embodiments, each of the dies 210-218 in the stack 200 may include a PLL rather than a DLL to generate an internal clock signal. PLLs are used to generate an internal periodic signal such as an internal clock signal based on a periodic reference signal such as, for example, an external clock signal. A PLL adjusts a phase of the internal periodic signal with an oscillator to maintain a specific phase relationship with the periodic reference signal. PLLs are used, for example, in high-speed clocked memories such as synchronous dynamic random access memory (SDRAM) devices. A PLL may be shut off with an enable/disable control line that would either keep the oscillator in a reset state or set an oscillator voltage to zero volts. An enable/disable control line for each of the PLLs may be set using a fuse or an antifuse. In various embodiments, the dies 210-218 in the stack 200 may include an assortment of PLLs and DLLs to generate internal clock signals.

In various embodiments, two or more DLLs or PLLs in the stack 200 are operated to generate clock signals that are distributed to the dies 210-218 through two or more of the channels 260-270. Other DLLs or PLLs in the dies 210-218 are capable of being shut off to reduce power consumption in the stack 200. One of the dies 210-218 having a DLL or PLL operated to generate a clock signal may be called a generator die or a source die. Another of the dies 210-218 having a DLL or PLL operated to generate a clock signal may be called an auxiliary die operated to generate an auxiliary clock signal.

The dies 210-218 may have a different order, arrangement, or orientation with respect to each other in the stack 200 according to various embodiments. The stack 200 may include more or fewer dies according to various embodiments. In various embodiments, one or more of the dies 210-218 in the stack 200 include a DLL or a PLL, and others of the dies 210-218 do not include a DLL or a PLL. The dies 210-218 may communicate with other external devices such as a processor, a memory controller, or another device through an interface circuit (not shown).

Figure 3:
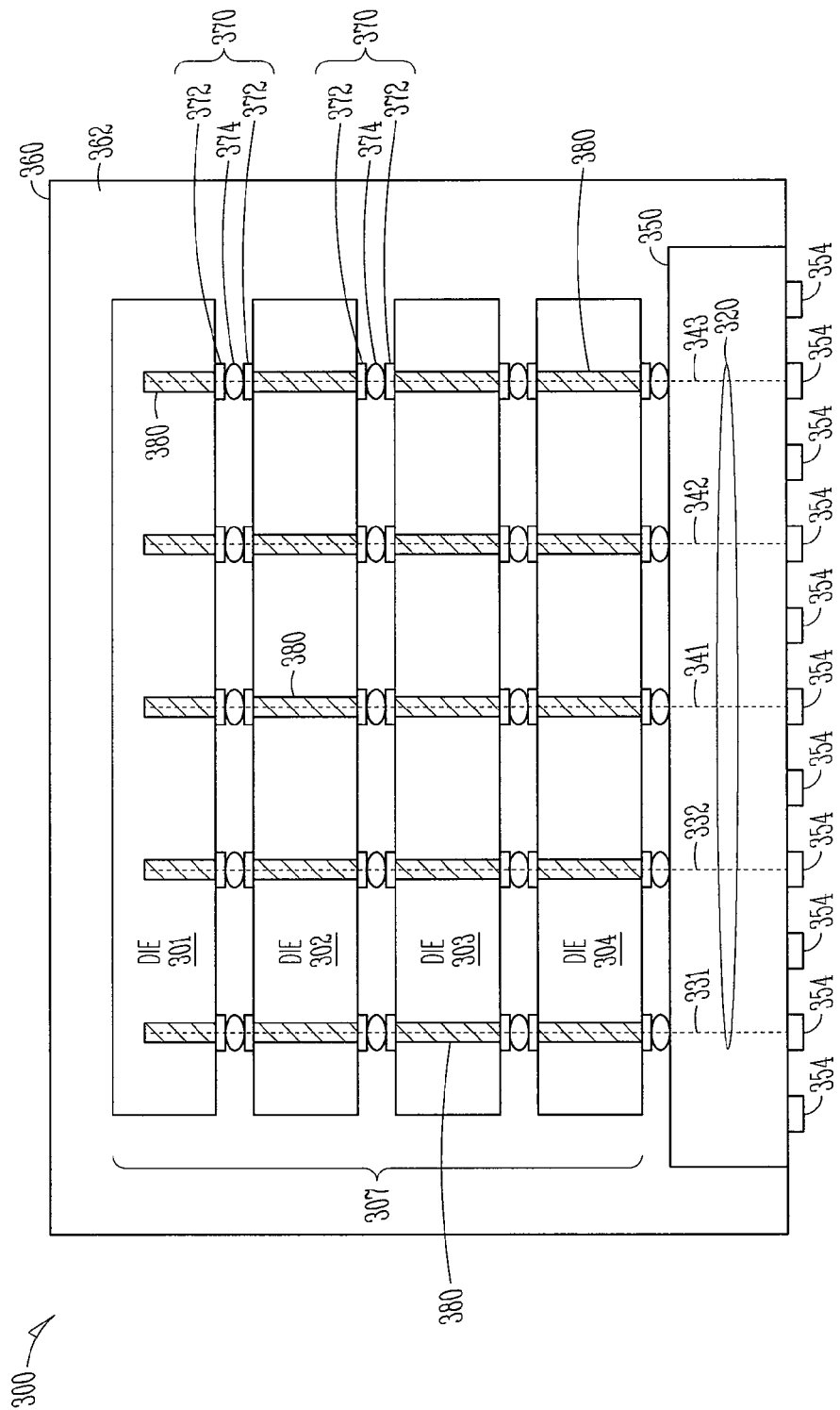
FIG. 3 is a partial cross section of an integrated circuit package having multiple separate integrated circuit dies arranged in a stack according to various embodiments of the invention.

FIG. 3 is a partial cross section of an integrated circuit package 300 having multiple separate integrated circuit dies 301, 302, 303, and 304 arranged in a stack 307 according to various embodiments of the invention. Each of the integrated circuit dies 301, 302, 303, and 304 is formed from a semiconductor material and includes electronic circuitry. The dies 301-304 may each include circuit components of a single memory device or a single processor. Alternatively, the dies 301-304 collectively may include circuitry of a memory device or a processor.

The package 300 includes a group 320 of channels 331, 332, 341, 342, and 343. Each channel 331, 332, 341, 342, and 343 is shown as a broken line in FIG. 3 that extends through or into the dies 301, 302, 303, and 304 in the stack 307. Each channel 331, 332, 341, 342, and 343 may be a conductive path and may be referred to as a "through wafer interconnect" (TWI) or a "through silicon via" (TSV).

The package 300 includes a support 350 coupled to the dies 301-304. The support 350 may be a ceramic or organic package substrate. Multiple contacts 354 are coupled to the support 350 to enable the dies 301-304 to communicate with another device such as a processor or a memory controller. Some of the contacts 354 may form portions of the channels 331, 332, 341, 342, and 343. The package 300 includes an enclosure 360 which may enclose at least a part of the support 350 and the dies 301-304. An interior space 362 between the enclosure 360 and the dies 301-304 may be filled with a filling material, a gas, a liquid, or a combination thereof. The filling material may include a polymer material.

An interface circuit (not shown) may be located in the die 304, and this interface circuit may be a logic circuit and may be similar to or identical to the interface circuit 110 shown in FIG. 1. The interface circuit may include circuit components, for example buffers and I/O drivers, to facilitate the transfer of information at appropriate data transfer rates between the dies 301, 302, 303, and 304 and another device such as a processor or a memory controller (not shown).

The dies 301-304 can be substantially equal in size and are stacked vertically on, or with respect to, the support 350. In other words, the dies 301-304 are stacked along a line substantially perpendicular to a larger surface of the support 350. The dies 301-304 may have a different order, arrangement, or orientation with respect to the support 350 and/or to each other according to various embodiments of the invention.

The dies 301-304 may be formed separately and then arranged in the stack 307 as shown in FIG. 3. The dies 301-304 are attached to each other at a number of joints 370. Each joint 370 is located between two of the dies 301-304. Each joint 370 includes two bond pads 372, one bond pad 372 being adhered to each respective die 301-304, and an electrically conductive material 374 between the bond pads 372. The conductive material 374 may include one or more of solder, copper, or a conductive adhesive.

Each channel 331, 332, 341, 342, and 343 includes at least one via 380 with a conductive material inside the via 380 that extends into or through one of the dies 301, 302, 303, and 304. A via 380 in one of the dies 301-304 is coupled to a via 380 in another one of the dies 301-304 through one of the joints 370 that couple distal ends of the vias 380 to each other. The vias 380 extend all the way through some of the dies 302, 303, and 304 and extend into, but not through, the die 301 at one end of the stack 307. Each channel 331, 332, 341, 342, and 343 includes selected ones of the vias 380 extending through the dies 302, 303, and 304 and into the die 301 coupled together by the joints 370. The conductive material inside the vias 380 may include one or more of solder, copper, or another conductive material.

The stack 307 may be formed in a flip-chip fashion in which the die 301 is used as a base as shown in FIG. 3. The die 302 is attached to the die 301, the die 303 is then attached to the die 302, and finally the die 304 is attached to the die 303. The conductive material 374 is used to bond the bond pads 372 of one die to the bond pads 372 of another die while the dies 301, 302, 303, and 304 are assembled in the stack 307. After the dies 301, 302, 303, and 304 are assembled in the stack 307, they may be flipped over and then attached at the die 304 to the support 350. The package 300 may be assembled using other techniques according to various embodiments of the invention. The stack 307 may include more or fewer dies according to various embodiments of the invention.

In various embodiments, a single DLL or PLL in one of the dies 301-304 in the stack 300 is operated to generate a clock signal that is distributed to others of the dies 301-304 in the stack 300 through one or more of the channels 331, 332, 341, 342, and 343. The one of the dies 301-304 operated to generate the clock signal may be called a generator die or a source die, and the other ones of the dies 301-304 receiving the clock signal may be called receiver dies. Other DLLs or PLLs in the dies 301-304 can be shut off to reduce power consumption in the stack 300. In various embodiments, two or more DLLs or PLLs in the stack 300 are operated to generate clock signals that are distributed to the dies 301-304 through two or more of the channels 331, 332, 341, 342, and 343. A second one of the dies 301-304 operated to generate a clock signal may be called an auxiliary die operated to generate an auxiliary clock signal. Other DLLs or PLLs in the dies 301-304 are capable of being shut off to reduce power consumption in the stack 300. The dies 301-304 may include processors and/or memory devices such as Flash memory devices, DRAMs, or SDRAMs. The dies 301-304 may be of the same design or may be of different designs.

The stacks 100, 200, and 300 shown and described herein with reference to FIG. 1 through FIG. 3 are vertical stacks in which dies are arranged in a substantially linear orientation. The individual dies in a stack may be arranged on a planar surface such as a circuit board according to various embodiments of the invention. The individual dies in a stack may have any other order, arrangement, or orientation with respect to each other according to various embodiments.

Figure 4:
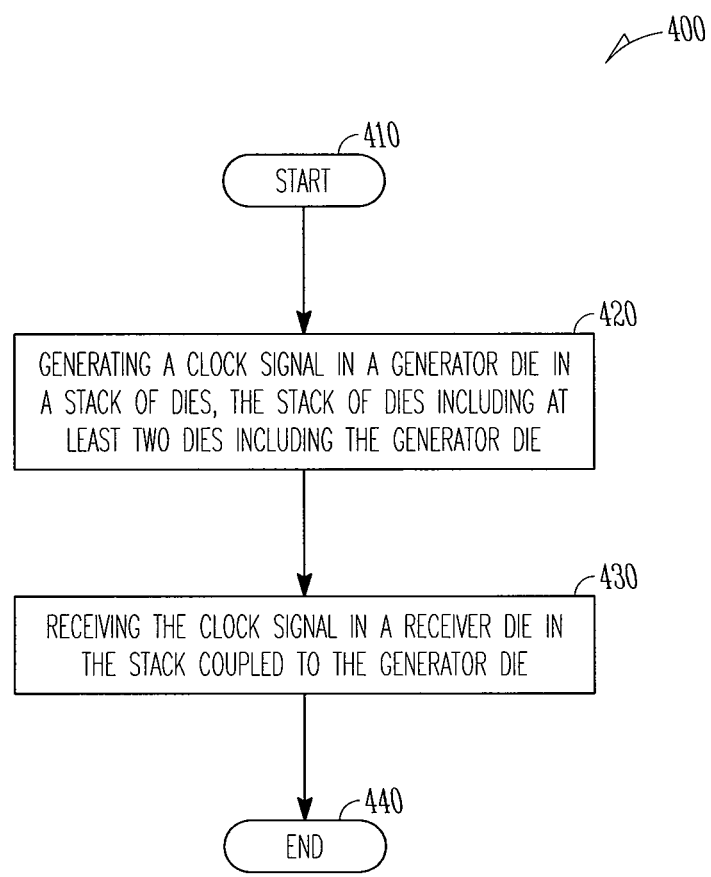
FIG. 4 is a flow diagram of operations or methods according to various embodiments of the invention.

FIG. 4 is a flow diagram of operations or methods 400 according to various embodiments of the invention. In block 410, the methods 400 start. In block 420, a clock signal is generated in a generator die in a stack of dies, the stack of dies including at least two dies including the generator die. In block 430, the clock signal is received in a receiver die in the stack coupled to the generator die. In block 440, the methods 400 end.

The individual activities of the operations or methods 400 do not have to be performed in the order shown or in any particular order. Some activities may be repeated, and others may occur only once. Various embodiments may have more or fewer activities than those shown in FIG. 4.

Figure 5:
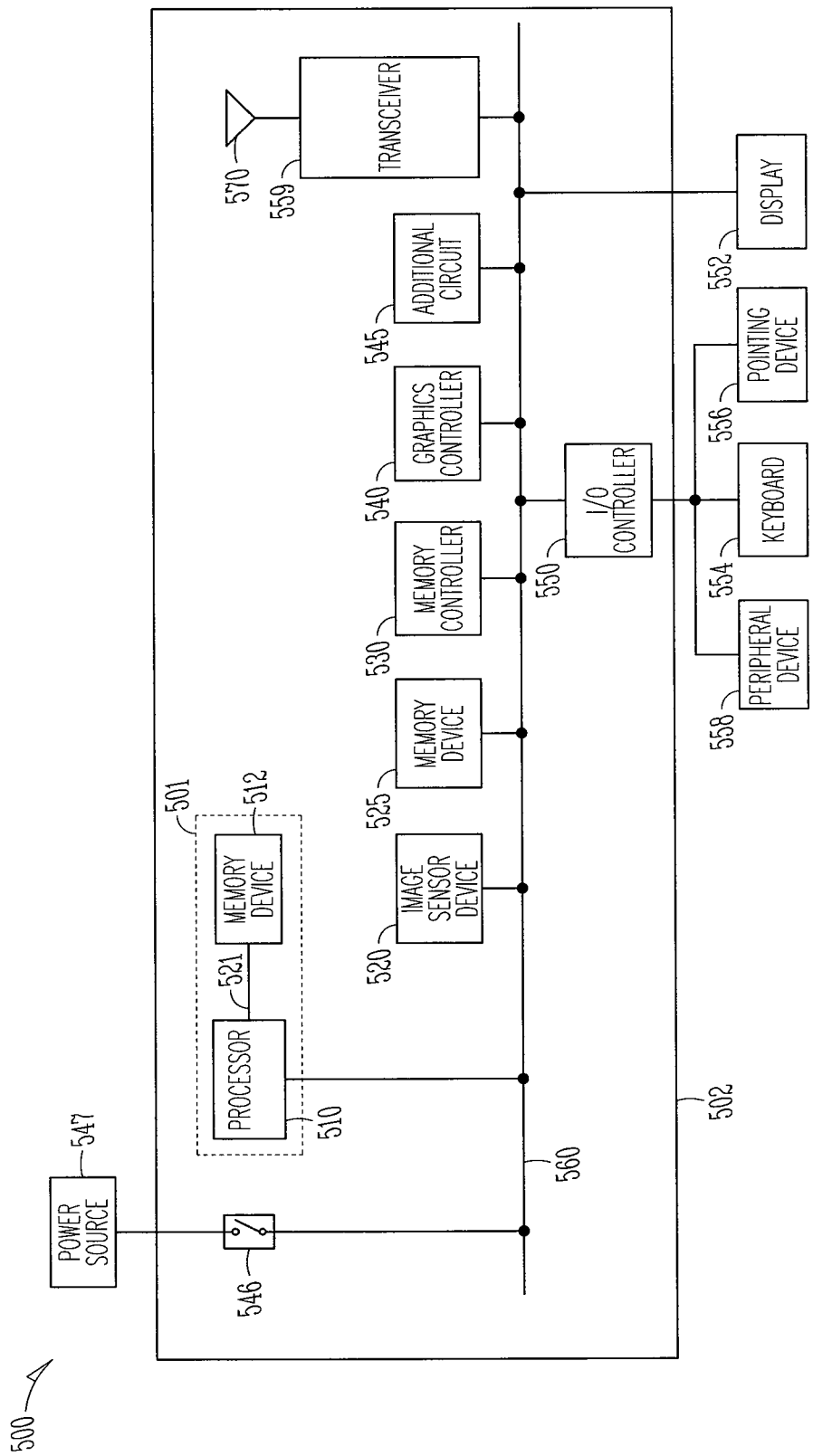
FIG. 5 is a block diagram of a system according to various embodiments of the invention.

FIG. 5 is a block diagram of a system 500 according to various embodiments of the invention. The system 500 may include a processor 510, a first memory device 512, an image sensor device 520, a second memory device 525, a memory controller 530, a graphics controller 540, an additional circuit 545, an input and output (I/O) controller 550, a display 552, a keyboard 554, a pointing device 556, a peripheral device 558, and a system transceiver 559. The system 500 may also include a bus 560 to transfer information among the components of the system 500 and to provide power to at least some of these components, a circuit board 502 where some of the components of system may be attached, and an antenna 570 to wirelessly transmit and receive information to and from the system 500. The transceiver 559 may operate to transfer information from one or more components of the system 500 such as the processor 510 or the memory device 525 to the antenna 570. The transceiver 559 may also operate to transfer information received at the antenna 570 to at least one of the processor 510 and the memory devices 525 and 512. Information received at the antenna 570 may be transmitted to the system 500 by a source external to the system 500.

The system 500 may also include a switch 546 such as a push button switch coupled to the bus 560 and a power source 547. The switch 546 may be engaged to couple power from the power source 547 to one or more of the components of system 500 such as the processor 510 or the memory device 512.

The processor 510 may include a general-purpose processor or an application specific integrated circuit (ASIC). The processor 510 may include a single core processor or a multiple-core processor. The processor 510 may execute one or more programming commands to process information. The information may include digital output information provided by other components of system 500 such as the image sensor device 520 or the memory device 525.

Each of the memory devices 525 and 512 may include a volatile memory device, a non-volatile memory device, or a combination of both. For example, the memory device 525 may comprise a dynamic random access memory (DRAM) device, a static random access memory (SRAM) device, a flash memory device, or a combination of these memory devices.

Each of the memory devices 525 and 512 and/or the processor 510 may be arranged in a stack of integrated circuit dies according to the various embodiments described herein, such as the stacks 100, 200, or 300 shown and described with reference to FIG. 1 through FIG. 3. Each of the memory devices 525 and 512 and/or the processor 510 may be operated according to the operations or methods 400 shown and described with reference to FIG. 4.

Some components of the system 500 may be arranged together such that the system 500 may include a system in package (SIP). For example, the memory device 512 and the processor 510 may be a part of a SIP 501 or the entire SIP 501 in which the memory device 512 may be used as a cache memory for the processor 510. The memory device 512 may be a level L1 cache, a level L2 cache, a level L3 cache, or a combination thereof. The processor 510 and the memory device 512 may communicate with each other through one or more channels 521.

The image sensor device 520 may include a complementary metal-oxide-semiconductor (CMOS) image sensor having a CMOS pixel array or charge-coupled device (CCD) image sensor having a CCD pixel array. The display 552 may include an analog display or a digital display. The display 552 may receive information from other components. For example, the display 552 may receive and display information such as text or images that is processed by one or more of the image sensor device 520, the memory device 525, the graphics controller 540, and the processor 510.

The additional circuit 545 may include circuit components used in a vehicle (not shown). The additional circuit 545 may receive information from other components to activate one or more subsystems of the vehicle. For example, the additional circuit 545 may receive information that is processed by one or more of the image sensor device 520, the memory device 525, and the processor 510 to activate one or more of an air bag system, a vehicle security alarm, and an obstacle alert system.

Clock signal distribution mechanisms presented herein may provide increased efficiency by reducing power consumption in a collection of dies. A clock signal from a DLL or a PLL or multiple clock signals from multiple DLLs or PLLs can be distributed through a collection of dies. One or more other DLLs or PLLs in the collection can be shut off to reduce power consumption. In addition, data may be clocked out of the dies according to the same clock signal. This can lead to a significant performance improvement.

Any of the circuits or systems described herein may be referred to as a module. A module may comprise a circuit and/or firmware according to various embodiments.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the claims. In addition, in the foregoing Detailed Description, it can be seen that various features are arranged together for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of one or more of the disclosed embodiments. Thus, the following claims are hereby incorporated into the Detailed Description, with each claim standing on its own as a separate embodiment.

What is claimed is:

1. An apparatus comprising:
a first channel to transfer a first clock enable signal from a first semiconductor die to a second semiconductor die in a stack when a first clock generator circuit in the first semiconductor die is turned off, wherein the second semiconductor die comprises a second clock generator circuit and the stack comprises three or more semiconductor dice;
a second channel to transfer a second clock enable signal from a third semiconductor die to the second semiconductor die in the stack when a third clock generator circuit in the third semiconductor die is turned off; and
a third channel to transfer a clock signal from the second clock generator circuit in the second semiconductor die to the first semiconductor die and the third semiconductor die, the clock signal being generated in response to the first clock enable signal or the second clock enable signal.

2. The apparatus of claim 1, further comprising:
a fourth channel to transfer a third clock enable signal from a fourth semiconductor die to the second semiconductor die in the stack when a fourth clock generator circuit in the fourth semiconductor die is turned off; and
wherein the third channel is to transfer the clock signal from the second clock generator circuit in the second semiconductor die to the fourth semiconductor die.

3. The apparatus of claim 2, wherein the first channel, the second channel, the third channel and the fourth channel each comprise a conductive interconnect.

4. The apparatus of claim 3, wherein each conductive interconnect comprises a via coupled together by joints.

5. The apparatus of claim 2, further comprising a plurality of additional channels to transfer data, address and control information between the first semiconductor die, the second semiconductor die, the third semiconductor die and the fourth semiconductor die.

6. The apparatus of claim 2, wherein the first semiconductor die, the second semiconductor die, the third semiconductor die and the fourth semiconductor die each comprise a DRAM (dynamic random access memory) device or a flash memory device or a processor.

7. A method comprising:
turning off a first clock generator circuit in a first semiconductor die in a stack comprising three or more semiconductor dice;
transferring a first clock enable signal on a first channel from the first semiconductor die to a second semiconductor die in the stack, the second semiconductor die comprising a second clock generator circuit;
turning off a third clock generator circuit in a third semiconductor die in the stack;
transferring a second clock enable signal on a second channel from the third semiconductor die to the second semiconductor die in the stack;
generating a clock signal in the second clock generator circuit in response to the first clock enable signal or the second clock enable signal; and
transferring the clock signal from the second clock generator circuit in the second semiconductor die on a third channel to the first semiconductor die and the third semiconductor die.

8. The method of claim 7, wherein generating the clock signal in the second clock generator circuit further comprises generating the clock signal in a DLL (delay-locked loop) or a PLL (phase-locked loop) coupled to receive an external periodic signal and to generate the clock signal from the external periodic signal.

9. The method of claim 7, wherein:
turning off the first clock generator circuit in the first semiconductor die further comprises turning off the first clock generator circuit in a first DRAM (dynamic random access memory) device or a first flash memory device or a first processor;
transferring the first clock enable signal on the first channel from the first semiconductor die to the second semiconductor die further comprises transferring the first clock enable signal on the first channel from the first semiconductor die to a second DRAM device or a second flash memory device or a second processor; and
turning off the third clock generator circuit in the third semiconductor die further comprises turning off the third clock generator circuit in a third DRAM device or a third flash memory device or a third processor.

10. An apparatus comprising:
a first control circuit in a first semiconductor memory die in a stack to generate a first clock enable signal when a first clock generator circuit in the first semiconductor memory die is turned off, the stack comprising three or more semiconductor memory dice;
a second control circuit in a second semiconductor memory die in the stack to generate a second clock enable signal when a second clock generator circuit in the second semiconductor memory die is turned off;
a third control circuit in a third semiconductor memory die in the stack to receive the first clock enable signal from the first control circuit and the second clock enable signal from the second control circuit and to instruct a third clock generator circuit in the third semiconductor memory die to generate a clock signal in response to the first clock enable signal or the second clock enable signal, the clock signal to be transferred to the first semiconductor memory die and the second semiconductor memory die in the stack.

11. The apparatus of claim 10, further comprising:
a fourth control circuit in a fourth semiconductor memory die in the stack to generate a third clock enable signal when a fourth clock generator circuit in the fourth semiconductor memory die is turned off,
wherein the third control circuit is to receive the third clock enable signal from the fourth control circuit and is to instruct the third clock generator circuit in the third semiconductor memory die to generate the clock signal in response to the third clock enable signal.

12. The apparatus of claim 11, further comprising a plurality of channels in the stack to transfer the first clock enable signal, the second clock enable signal, the third clock enable signal and the clock signal between the semiconductor memory dice.

13. The apparatus of claim 11, wherein each of the first semiconductor memory die, the second semiconductor memory die, the third semiconductor memory die and the fourth semiconductor memory die comprises a DRAM (dynamic random access memory) device or a flash memory device.

14. A method comprising:
turning off a first clock generator circuit in a first semiconductor memory die in a stack comprising three or more semiconductor memory dice;
generating a first clock enable signal in a first control circuit in the first semiconductor memory die;
turning off a second clock generator circuit in a second semiconductor memory die in the stack;
generating a second clock enable signal in a second control circuit in the second semiconductor memory die;
receiving the first clock enable signal from the first control circuit and the second clock enable signal from the second control circuit in a third control circuit in a third semiconductor memory die in the stack;
instructing a third clock generator circuit in the third semiconductor memory die to generate a clock signal in response to the first clock enable signal or the second clock enable signal; and
transferring the clock signal to the first semiconductor memory die and the second semiconductor memory die in the stack.

15. The method of claim 14, further comprising:
turning off a fourth clock generator circuit in a fourth semiconductor memory die in the stack;
generating a fourth clock enable signal in a fourth control circuit in the fourth semiconductor memory die; and
transferring the fourth clock enable signal to the third control circuit in the third semiconductor memory die in the stack.

16. The method of claim 14, wherein instructing the third clock generator circuit in the third semiconductor memory die to generate the clock signal further comprises instructing a DLL (delay-locked loop) or a PLL (phase-locked loop) coupled to receive an external periodic signal to generate the clock signal from the external periodic signal in the third semiconductor memory die.

17. A method comprising:
generating an output signal in a first clock generator circuit in a first semiconductor die in response to a clock enable signal from a second semiconductor die and a clock enable signal from a third semiconductor die in a semiconductor die stack;

receiving the output signal in the second semiconductor die through one or more conductive interconnects coupled to the first semiconductor die when a second clock generator circuit in the second semiconductor die is turned off; and receiving the output signal in the third semiconductor die through one or more of the conductive interconnects coupled to the first semiconductor die when a third clock generator circuit in the third semiconductor die is turned off.

18. The method of claim 17, wherein:

receiving the output signal in the second semiconductor die through one or more conductive interconnects coupled to the first semiconductor die further comprises receiving the output signal in the second semiconductor die through one or more vias coupled together by joints that are coupled to the first semiconductor die; and receiving the output signal in the third semiconductor die through one or more of the conductive interconnects coupled to the first semiconductor die further comprises receiving the output signal in the third semiconductor die through one or more vias coupled together by joints that are coupled to the first semiconductor die.

19. The method of claim 17, further comprising:

generating the output signal in the first clock generator circuit in the first semiconductor die in response to a clock enable signal from a fourth semiconductor die; and receiving the output signal in the fourth semiconductor die through one or more of the conductive interconnects coupled to the first semiconductor die when a fourth clock generator circuit in the fourth semiconductor die is turned off.

20. The method of claim 17, wherein:

generating the output signal in a first clock generator circuit in the first semiconductor die further comprises generating the output signal in a first clock generator circuit in a first DRAM (dynamic random access memory) device or a first flash memory device or a first processor;

receiving the output signal in the second semiconductor die further comprises receiving the output signal in a second DRAM device or a second flash memory device or a second processor; and receiving the output signal in the third semiconductor die further comprises receiving the output signal in a third DRAM device or a third flash memory device or a third processor.

21. The method of claim 17, wherein generating an output signal in a first clock generator circuit in a first semiconductor die further comprises generating the output signal in a DLL (delay-locked loop) or a PLL (phase-locked loop) coupled to receive an external periodic signal and to generate the output signal from the external periodic signal.

22. The method of claim 17, further comprising communicating with devices outside the semiconductor die stack with an interface circuit in the first semiconductor die or the second semiconductor die or the third semiconductor die.

23. The method of claim 17, further comprising:

performing a task in the second semiconductor die using the output signal; and performing a task in the third semiconductor die using the output signal.

24. A method comprising:

turning off a first clock generator circuit in a first semiconductor memory die in a stack of semiconductor memory devices to conserve power;

turning off a second clock generator circuit in a second semiconductor memory die in the stack of semiconductor memory devices to conserve power;

providing a first control signal on one of a plurality of conductive interconnects from the first semiconductor memory die and a second control signal on one of the conductive interconnects from the second semiconductor memory die to a third semiconductor memory die in the stack of semiconductor memory devices to instruct a third clock generator circuit in the third semiconductor memory die to generate an internal clock signal; and coupling the internal clock signal generated by the third clock generator circuit to the first semiconductor memory die and the second semiconductor memory die through at least one of the conductive interconnects.

25. The method of claim 24, wherein:

turning off the first clock generator circuit in the first semiconductor memory die further comprises turning off a first DLL (delay-locked loop) or a first PLL (phase-locked loop) in a first DRAM (dynamic random access memory) device or a first flash memory device;

turning off the second clock generator circuit in the second semiconductor memory die further comprises turning off a second DLL or a second PLL in a second DRAM device or a second flash memory device; and coupling the internal clock signal generated by the third clock generator circuit further comprises coupling the internal clock signal generated by a third DLL or a third PLL in a third DRAM device or a third flash memory device to the first semiconductor memory die and the second semiconductor memory die.

26. The method of claim 24, further comprising:

turning off a fourth clock generator circuit in a fourth semiconductor memory die in the stack of semiconductor memory devices to conserve power;

providing a third control signal on one of the plurality of conductive interconnects from the fourth semiconductor memory die to the third semiconductor memory die to instruct the third clock generator circuit in the third semiconductor memory die to generate the internal clock signal; and coupling the internal clock signal generated by the third clock generator circuit to the fourth semiconductor memory die through at least one of the conductive interconnects.

27. The method of claim 25, further comprising coupling control signals, data signals and address signals on the conductive interconnects between the first semiconductor memory die, the second semiconductor memory die and the third semiconductor memory die in the stack of semiconductor memory devices.

28. The method of claim 24, further comprising:

performing a task in the first semiconductor memory die using the internal clock signal; and performing a task in the second semiconductor memory die using the internal clock signal.

* * * * *